United States Patent
Ono et al.

(10) Patent No.: US 12,025,832 B2
(45) Date of Patent: Jul. 2, 2024

(54) PHOTO-DETECTOR

(71) Applicant: Nippon Telegraph and Telephone Corporation, Tokyo (JP)

(72) Inventors: Masaaki Ono, Tokyo (JP); Katsumasa Yoshioka, Tokyo (JP); Kengo Nozaki, Tokyo (JP); Akihiko Shinya, Tokyo (JP); Masaya Notomi, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 18/261,808

(22) PCT Filed: Feb. 8, 2021

(86) PCT No.: PCT/JP2021/004544
§ 371 (c)(1),
(2) Date: Jul. 17, 2023

(87) PCT Pub. No.: WO2022/168299
PCT Pub. Date: Aug. 11, 2022

(65) Prior Publication Data
US 2024/0069280 A1   Feb. 29, 2024

(51) Int. Cl.
*G02B 6/122*   (2006.01)
*G02B 5/00*    (2006.01)
*G02B 6/24*    (2006.01)
*H01L 31/0224* (2006.01)

(52) U.S. Cl.
CPC ........... *G02B 6/1226* (2013.01); *G02B 5/003* (2013.01); *G02B 6/243* (2013.01); *H01L 31/022466* (2013.01)

(58) Field of Classification Search
CPC ...... G02B 6/243; G02B 6/1226; G02B 5/003; H01L 31/022466
See application file for complete search history.

(56) References Cited

U.S. PATENT DOCUMENTS

| | | | |
|---|---|---|---|
| 11,009,658 B2 * | 5/2021 | Jones | G02B 6/1226 |
| 11,616,161 B2 * | 3/2023 | Ferrari | H01L 31/028 438/57 |

FOREIGN PATENT DOCUMENTS

JP   2014170126 A   9/2014

OTHER PUBLICATIONS

Muench et al., "Waveguide-Integrated, Plasmonic EnhancedGraphene Photodetectors," Nano Letters, vol. 19, Sep. 2019, pp. 7632-7644. As discussed in the specification.
(Continued)

*Primary Examiner* — Seung C Sohn
(74) *Attorney, Agent, or Firm* — Slater Matsil, LLP

(57) ABSTRACT

A photodetector includes a substrate, a material layer, a first electrode made of a metal, a core, a second electrode and a light absorption layer made of graphene. The first electrode, the core, and the material layer constitute a hybrid plasmonic waveguide, and the light absorption layer is disposed thereon. Light guided in the hybrid plasmonic waveguide is absorbed by the light absorption layer, photoelectrically converted by the PTE effect, and extracted as an electric signal from the first electrode and the second electrode.

18 Claims, 10 Drawing Sheets

(56) References Cited

OTHER PUBLICATIONS

Ono et al., "Ultrafast and energy-efficient all-optical switching with graphene-loaded deep-subwavelength plasmonic waveguides," Nature Photonics, vol. 14, Jan. 2020, pp. 37-43. As discussed in the specification.
Ming et al., "A graphene-based broadband optical modulator," Nature, vol. 474, Jun. 2011, pp. 64-67. As discussed in the specification.
Ding et al., "Efficient electro-optic modulation in low-lossgraphene-plasmonic slot waveguides," Nanoscale, vol. 9, Sep. 2017, pp. 15576-15581. As discussed in the specification.

* cited by examiner

PHOTO-DETECTOR

CROSS-REFERENCE TO RELATED APPLICATIONS

This application is a national phase entry of PCT Application No. PCT/JP2021/004544, filed on Feb. 8, 2021, which application is hereby incorporated herein by reference.

TECHNICAL FIELD

The present invention relates to a photodetector using graphene.

BACKGROUND

Graphene exhibits high-efficiency absorption in a wide wavelength range from ultraviolet to infrared, and has very short carrier relaxation time and high mobility. Furthermore, since graphene can be integrated with CMOS, application to a high-efficiency and ultra-high-speed on-chip photodetector is expected. On the other hand, since graphene is a sheet-like material having a single-atom film thickness, it is difficult for it to efficiently interact with light. For example, in general, in a structure in which graphene is stuck on a silicon thin wire waveguide used as an optical waveguide, when 50% of input light is absorbed by the graphene, an element having a length of 30 μm or more is required, and the on-chip optical element becomes large in size (NPL 1).

One method of enhancing the interaction of light and graphene is introduction of a plasmonic waveguide. The plasmonic waveguide is a nano-sized optical waveguide that uses a metal and a dielectric as materials. In the plasmonic waveguide, light propagates as a near field. Therefore, the light can be confined in a small region exceeding the diffraction limit of the light, and a locally strong electric field enhancement effect can be obtained. As a result, the interaction with the nano material can be enhanced.

As an optical element using graphene and plasmonic waveguides, an optical modulator utilizing an electro-optical effect (NPL 2), a total optical switch utilizing ultra-high speed optical nonlinearity of graphene (NPL 3), and the like have been reported so far. Further, in recent years, attention has been paid to the high speed of graphene, and the movement of applying a graphene-disposed plasmonic waveguide to a photodetector is also active.

However, since the graphene is a semimetal, when applied to photodetection, the application of a bias voltage between the electrodes increases a dark current. For this reason, an operation under zero bias is required, and improvement in sensitivity due to application of bias voltage is not expected like a general photodiode. Therefore, more enhancement of the interaction by the plasmonic waveguide is required.

As the principle of photoelectric conversion which can be expected by zero bias operation, there is a photothermoelectric (PTE) effect. The PTE effect is a kind of Seebeck effect, and a potential difference occurs in the material due to the Seebeck coefficient of the material and a temperature gradient originating from light. In the electron system of graphene, a high electron temperature is realized in a very short time by photoexcitation, but a relatively long time is required for subsequent interaction with phonons, and a high electron temperature is maintained. Therefore, the PTE effect in graphene is derived from an electron temperature higher than the lattice temperature. As the graphene PTE effect photodetector based on plasmonic structure, a photodetector using a metal-dielectric-metal (MIM) waveguide has been reported so far (NPL 4).

CITATION LIST

Patent Literature

PTL 1—Japanese Patent Application Publication No. 2014-170126

Non Patent Literature

NPL 1—M. Liu et al., "A graphene-based broadband optical modulator," Nature, vol. 474, pp. 64-67, 2011.
NPL 2—Y. Ding et al., "Efficient electro-optic modulation in low-loss graphene-plasmonic slot waveguides," Nanoscale, vol. 9, pp. 15576-15581, 2017.
NPL 3—M. Ono et al., "Ultrafast and energy-efficient all-optical switching with graphene-loaded deep-subwavelength plasmonic waveguides," Nature Photonics, vol. 14, pp. 37-43, 2020.
NPL 4 J. E. Muench et al., "Waveguide-Integrated, Plasmonic Enhanced Graphene Photodetectors," Nano Letters, vol. 19, pp. 7632-7644, 2019.

SUMMARY

Technical Problem

The optical voltage obtained by the PTE effect is described as "Vph=∫s(x)·∇Te(x)dx . . . (1)", and is given by the integral of the product of the Seebeck coefficient and the electron temperature gradient between the two electrodes. Here, S(x) is a Seebeck coefficient at a certain position, and Te(x) is an electron temperature. A structure in which an MIM waveguide (NPL 4) and a dielectric waveguide are disposed at the center of a source electrode and a drain electrode has been reported so far. In this structure, since the electron temperature distribution is symmetrical between the electrodes, the Seebeck coefficient of the graphene needs to have reversed reference numerals between the source electrode and the drain electrode to obtain the optical voltage and the photocurrent.

It is known that the Seebeck coefficient in graphene can be modulated by controlling the chemical potential of graphene, and even in the structure using the MIM waveguide described above, the chemical potential is controlled by applying different gate electric fields to the graphene parts on both sides of the waveguide (NPL 4).

However, in general, pinning of chemical potential occurs on the contact surface between graphene and a metal, and it is difficult to modulate from the outside. Therefore, a configuration in which the chemical potential is controlled by inserting the insulating layer between the metal and the graphene is taken. On the other hand, since the propagation mode of light in the MIM waveguide is very strongly localized in the portion of the insulator to be the core, in order to increase the absorption of light by graphene, it is desirable that the graphene be as close as possible to the core of the MIM waveguide. Furthermore, since the MIM waveguide itself has a large propagation loss, when the insulating layer is inserted to separate the graphene from the waveguide core, light absorption in the graphene is not only simply reduced, but loss in the photodetector is also increased, which leads to a reduction in efficiency.

Embodiments of the present invention have been made to solve the above-described problems, and an object thereof is to reduce loss of the photodetection and increase efficiency in the photodetector using the graphene.

Solution to Problem

A photodetector according to embodiments of the present invention includes an insulating substrate; a dielectric layer which is made of a dielectric having a refractive index higher than that of the substrate, extends in a waveguide direction, and is formed on the substrate; a first electrode which is made of a metal, extends in the waveguide direction on one side of the dielectric layer, and is formed on the substrate to be spaced apart from the dielectric layer; a core which is made of a material having a refractive index lower than that of the dielectric layer, is formed between the dielectric layer and the first electrode, and extends in the waveguide direction; a second electrode which is made of a metal and formed on the substrate on the other side of the dielectric layer to be spaced apart from the dielectric layer; and a light absorption layer which is electrically connected to the first electrode and the second electrode, is formed on the core, and is made up of graphene. An interval between the dielectric layer and the second electrode is within a range in which light confinement is possible between the dielectric layer and the first electrode, and the interval between the dielectric layer and the second electrode is within a range in which light confinement is not possible between the dielectric layer and the second electrode.

Advantageous Effects of Embodiments of the Invention

As described above, according to embodiments of the present invention, a light absorption layer made of graphene is provided on the first electrode, the dielectric layer and the core between them, the first electrode is connected to the light absorption layer, and the second electrode connected to the light absorption layer has an interval with the dielectric layer within a range where light confinement is not possible between the second electrode and the dielectric layer. Accordingly, loss of light detection in a photodetector using graphene can be reduced and efficiency can be increased.

DETAILED DESCRIPTION OF ILLUSTRATIVE EMBODIMENTS

Hereinafter, a photodetector according to an embodiment of the present invention will be described.

First Embodiment

Figure 1:
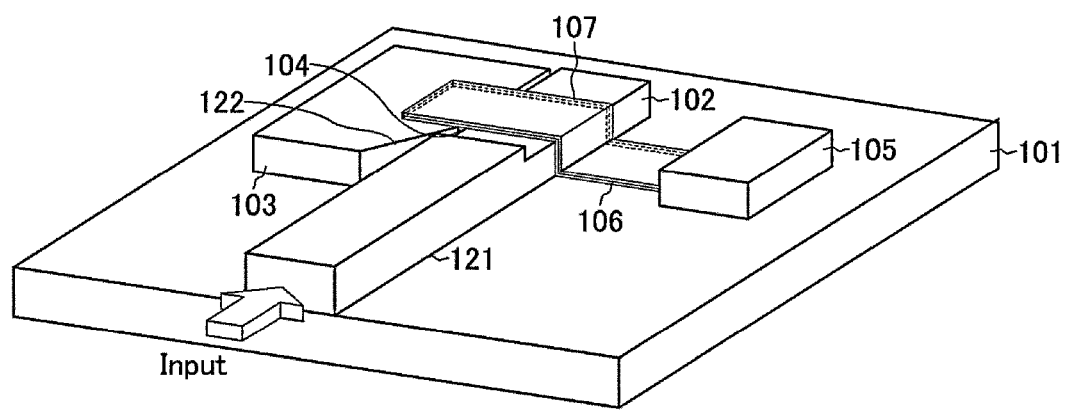
FIG. 1 is a perspective view showing a configuration of a photodetector according to a first embodiment of the present invention.
Figure 2:
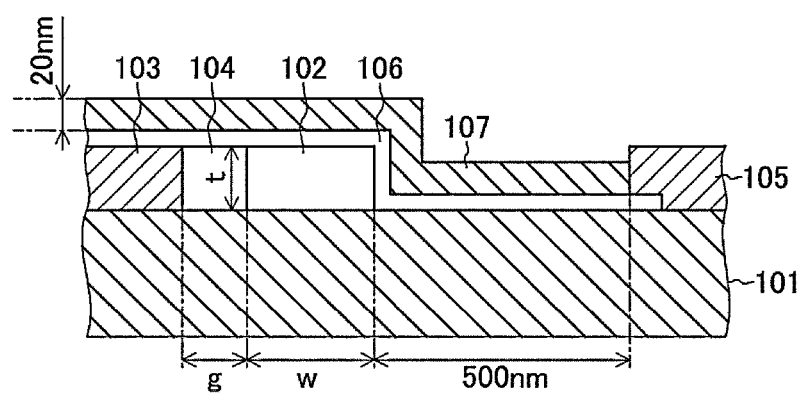
FIG. 2 is a cross-sectional view showing a configuration of the photodetector according to the first embodiment of the present invention.

First, a photodetector according to a first embodiment of the present invention will be described with reference to FIGS. 1 and 2. The photodetector includes a substrate 101, a dielectric layer 102, a first electrode 103, a core 104, a second electrode 105, and a light absorption layer 106. The photodetector has a configuration of a waveguide type.

The substrate 101 is made of, for example, an insulating material (insulator) such as silicon oxide. The dielectric layer 102 extends in the waveguide direction, and is formed on the substrate 101. The dielectric layer 102 is made up of a dielectric having a refractive index higher than that of the substrate 101. The dielectric layer 102 may be made up of a semiconductor such as, for example, silicon (Si).

The first electrode 103 is made up of a metal, and is formed to extend in a waveguide direction on one side of the dielectric layer 102. The first electrode 103 is formed on the substrate 101 apart from the dielectric layer 102. The first electrode 103 can be made of, for example, gold (Au).

The core 104 is formed between the dielectric layer 102 and the first electrode 103 and extends in a waveguide direction. The core 104 is made up of a material having a refractive index lower than that of the dielectric layer 102.

The second electrode 105 is made of a metal, and is formed on the substrate 101 on the other side of the dielectric layer 102 apart from the dielectric layer 102. The second electrode 105 may be made up of, for example, Au.

The light absorption layer 106 is electrically connected to the first electrode 103 and the second electrode 105, formed on the core 104, and made up of graphene. The light absorption layer 106 made up of graphene is disposed on the core 104 in a state in which light guided in the optical waveguide by the core 104 can be coupled, and electrically connected to the first electrode 103 and the second electrode 105.

The interval between the dielectric layer 102 and the second electrode 105 is set within a range in which light can be confined between the dielectric layer 102 and the first electrode 103. The interval between the dielectric layer 102 and the second electrode 105 is set within a range in which light confinement is not possible between the dielectric layer 102 and the second electrode 105.

Here, the core 104 can be formed of a space defined by the side surfaces of each of the dielectric layer 102 and the first electrode 103, and the lower surface of the light absorption layer 106 on the substrate 101 side. For example, the dielectric layer 102 may be made of silicon, and the core 104 may be made of air.

In this example, a protective layer 107 formed to cover the light absorption layer 106 is included. The protective layer 107 is made up of, for example, aluminum oxide ($Al_2O_3$) and protects the upper surface of the light absorption layer 106. The protective layer 107 may be omitted. When the protective layer 107 is not provided, the long-term stability may be lowered, but the manufacturing process can be simplified.

In the photodetector according to the first embodiment, the first electrode 103, the core 104, and the dielectric layer 102 constitute a hybrid plasmonic waveguide. An optical waveguide core 121 is connected to the core 104. The light guided by the optical waveguide core 121 through the optical waveguide is input to the hybrid plasmonic waveguide and absorbed by the light absorption layer 106. The light absorbed by the light absorption layer 106 is photoelectrically converted by the PTE effect, and taken out as an electric signal from the first electrode 103 and the second electrode 105.

For example, the dielectric layer 102 has a rectangular cross-sectional shape with a width of 400 nm and a height (thickness) of 20 nm, and the optical waveguide core 121 has a rectangular cross-sectional shape with a width of 400 nm and a height of 200 nm. A step in which the height changes from 200 nm to 20 nm is formed at a position where the optical waveguide core 121 and the dielectric layer 102 are connected (a position where the optical waveguide core 121 is changed to the dielectric layer 102). In this example, the direction in which the step extends in a plan view is perpendicular to the waveguide direction. The thickness (height) of the first electrode 103 is 20 nm, and the same thickness as that of the dielectric layer 102. The core 104, whose right and left are sandwiched between the first electrode 103 and the dielectric layer 102 when viewed from the plane of the substrate 101 and whose upper surface is covered with the light absorption layer 106, has the same height of the cross-sectional shape as that of the dielectric layer 102 and the first electrode 103, for example, 20 nm.

The first electrode 103 includes a tapered part 122 in which an interval between the dielectric layer 102 and the optical waveguide core 121 (an interval in a plane direction of the substrate 101) becomes wider as it goes away from the core 104. A mode converter is constituted by the tapered part 122, the mode of light guided in the optical waveguide by the optical waveguide core 121 is converted adiabatically by the mode converter, and the optical waveguide is highly efficiently coupled to the hybrid plasmonic waveguide described above.

According to the photodetector according to the first embodiment, since the guided light is concentrated in the vicinity of the first electrode 103 constituting the hybrid plasmonic waveguide, the electron temperature of the graphene constituting the light absorption layer 106 becomes high. On the other hand, in the vicinity of the second electrode 105, the electron temperature is low. As described above, according to the first embodiment, an asymmetric electron temperature distribution can be formed in the light absorption layer 106 made of graphene. As a result, an asymmetric Seebeck coefficient is not required, and a photovoltaic power (photovoltage) can be obtained in a state in which the light absorption layer 106 made of graphene is in contact with the first electrode 103 of the hybrid plasmonic waveguide.

Hereinafter, a more detailed description will be given. In the following, the substrate 101 is made up of $SiO_2$, the first electrode 103 and the second electrode 105 are made up of Au, the dielectric layer 102 is made up of Si, and the core 104 is air. The protective layer 107 made of $Al_2O_3$ is formed on the light absorption layer 106 made of graphene.

The height of a core 104 constituting the hybrid plasmonic waveguide is set as t (nm), the width of the core 104 being air is set as g (nm), the width of the dielectric layer 102 is set as w (nm), and the thickness of the protective layer 107 is set as 20 nm. The second electrode 105 is disposed apart from the dielectric layer 102 by about 500 nm. The hybrid plasmonic waveguide is coupled to an optical waveguide core 121 of Si having a core size of 400 nm×200 nm by a mode converter of a tapered part 122.

The hybrid plasmonic waveguide is not a pure plasmonic waveguide but can strongly confine light. Further, the propagation loss can be greatly reduced as compared with the plasmonic waveguide. These performances can be controlled by the values of w and t, and the performance of the hybrid plasmonic waveguide can be optimized by adjusting the balance between the confinement effect and the propagation loss.

Figure 3:
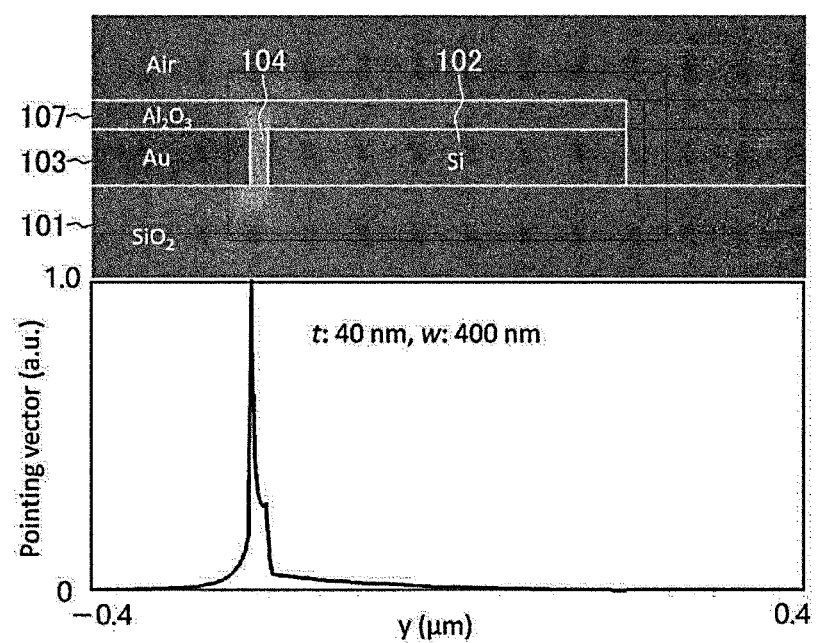
FIG. 3 is an explanatory view showing simulation results of the photodetector according to the first embodiment of the present invention.

FIG. 3 shows the numerical simulation result using the finite element method. FIG. 3 is the distribution of propagation modes of light at g=20 nm, w=400 nm, and t=40 nm, and the pointing vector at the corresponding graphene position. As shown in the simulation result, it is understood that light is concentrated on a very small air layer (core 104) according to the hybrid plasmonic waveguide of the above-mentioned conditions.

Since the graphene can be disposed in contact with the core 104 of the hybrid plasmonic waveguide, the light guided in the hybrid plasmonic waveguide and the graphene can strongly interact with each other. The magnitude of light absorption in graphene and the ratio to loss due to metal can be evaluated by the formula of "$\eta(L)=(\alpha_G/\alpha)\times(1-e^{-\alpha L})$ . . . (2), $\alpha=\alpha_G+\alpha_M$ . . . (3)". $(1-e^{-\alpha n})$ in $\eta$ represents the total absorption amount when the waveguide length L is used. $(\alpha_G/\alpha)$ is a ratio of the absorption coefficient of graphene only to the absorption coefficient of the entire system. That is, $\eta$ represents the amount of light absorption of graphene when the waveguide length L is used.

Figure 4A:
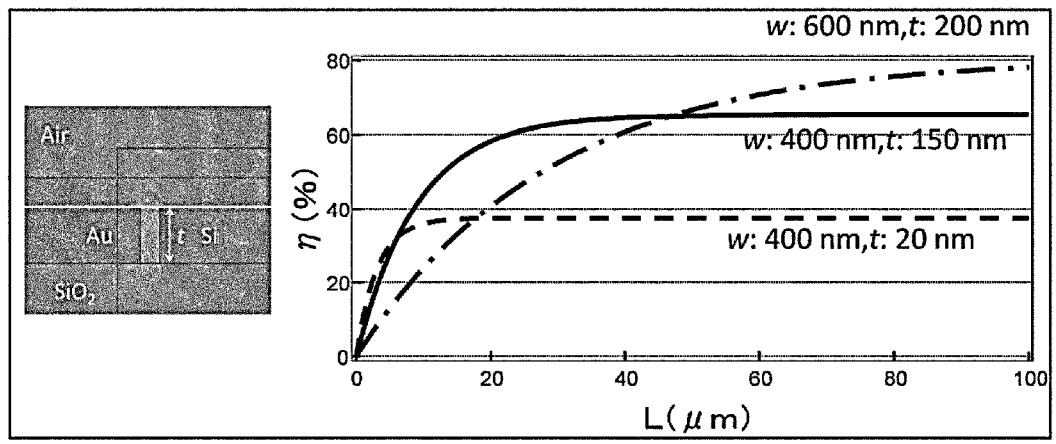
FIG. 4A is an explanatory view showing simulation results of the photodetector according to the first embodiment.
Figure 4B:
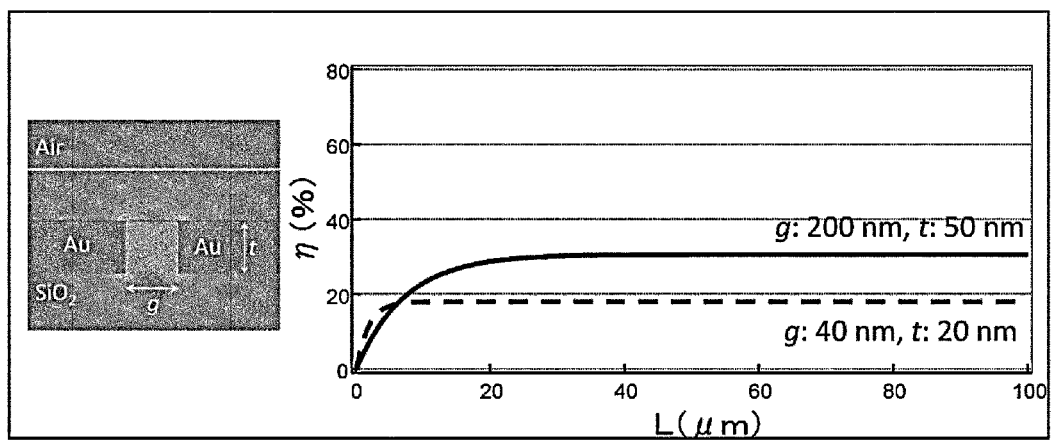
FIG. 4B is an explanatory view showing simulation results of the photodetector of the related art.

FIG. 4A shows a calculation result of q in a configuration in which graphene is combined with a hybrid plasmonic waveguide. This is the configuration of the photodetector according to the first embodiment. The dashed line is the calculation results of g=20 nm, w=600 nm, and t=200, the solid line is the calculation results of g=20 nm, w=400 nm, and t=150, and the broken line is the calculation results of g=20 nm, w=400 nm, and t=20. FIG. 4B shows a calculation result of a conventional photodetector in which graphene is combined with the MIM waveguide and an insulating layer having a thickness of 20 nm is provided between the MIM waveguide and the graphene. The solid line is the calculation result of g=200 nm and t=50 nm, and the broken line is the calculation result of g=40 nm and t=20 nm.

In this calculation result, the absorption amount in graphene per waveguide length is larger as the waveguide rises steeply, and represents that the absorption in the metal (first electrode 103) is effectively suppressed as the q at the infinite length of L is larger. According to the photodetector according to the first embodiment, it can be seen that light of 44% is absorbed at about L=10 μm under the conditions of g=20 nm, w=400 nm, and t=150 nm. It can be seen that the absorption by the metal can be dramatically suppressed as compared with the conventional photodetector shown in FIG. 4B.

It is known that the optical voltage obtained by the PTE effect is given by the equation (1), and the difference between the electron temperature and the lattice temperature in a finite system has the relation of "$\Delta Te(x)=T_e(x)-T_0 \propto P^*$ . . . (4)". $P^*$ is the power of the light absorbed in the graphene. That is, the amount of light absorption greatly affects the performance of the photodetector due to the PTE effect. As shown in FIG. 4A, the amount of absorption of light in the graphene (light absorption layer) is very high in the hybrid plasmonic waveguide, and a highly efficient photodetector with a short waveguide length can be realized.

Figure 5:
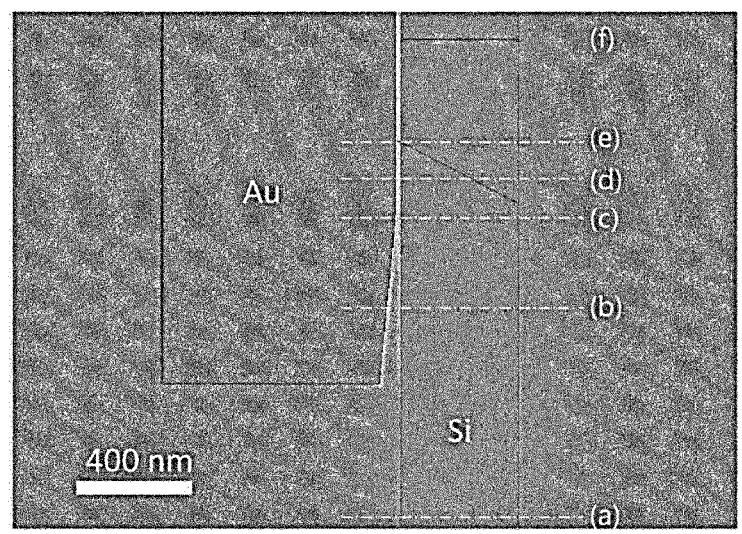
FIG. 5 is a distribution diagram showing the state of propagation of light to a hybrid plasmonic waveguide.
Figure 6:
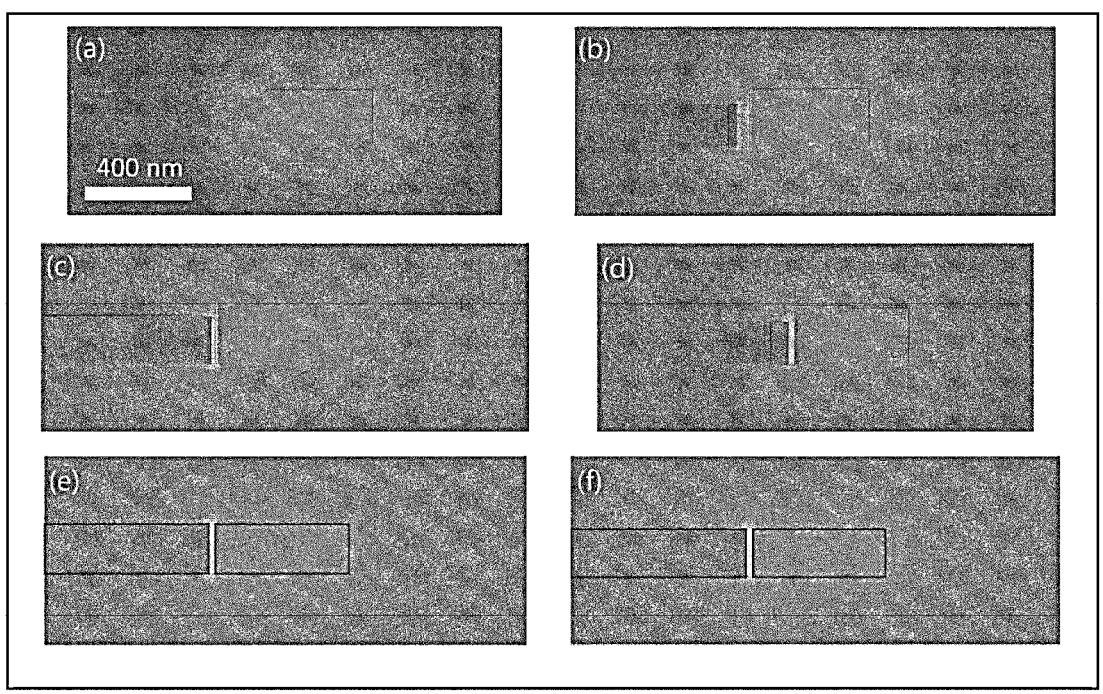
FIG. 6 is a distribution diagram showing the state of propagation of light to the hybrid plasmonic waveguide.

Light can be input to the aforementioned hybrid plasmonic waveguide with high efficiency. FIGS. 5 and 6 show the propagation state of light using the finite element method. FIG. 5 shows a state of a hybrid plasmonic waveguide (photodetector) in plan view, and FIG. 6 shows a cross-sectional view taken along each dashed line of FIG. 5. Here, the state of input from a Si thin wire waveguide (Si) with core size 400 nm×200 nm to a hybrid plasmonic waveguide with g=20 nm, w=400 nm, t=150 nm was calculated.

The propagation mode in the Si thin wire waveguide is converted to the propagation mode of the hybrid plasmonic waveguide in an adiabatic manner through the tapered part of the first electrode (Au). The conversion efficiency in this mode conversion is −0.27 dB and light of about 94% can be input. The conversion efficiency is further improved by tapering the connected boundary between the optical waveguide core and the dielectric layer of the Si thin wire waveguide. For example, the above-mentioned taper of the boundary can be realized by making an angle from the direction of the step of the portion where the optical waveguide core of the Si thin wire waveguide is connected to the dielectric layer (the portion where the optical waveguide core is changed to the dielectric layer) extending in a plan view from the direction perpendicular to the waveguide direction.

Second Embodiment

Figure 7:
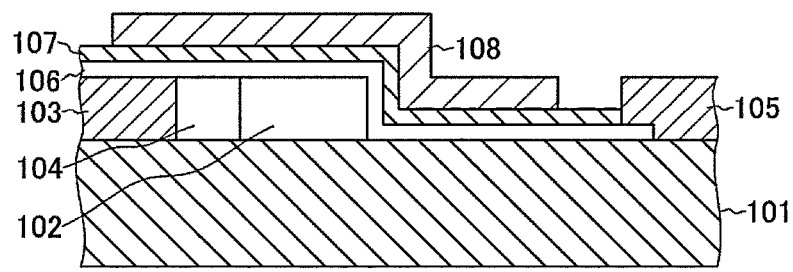
FIG. 7 is a cross-sectional view showing a configuration of a photodetector according to a second embodiment of the present invention.

Next, the photodetector according to a second embodiment of the present invention will be described with reference to FIG. 7. The photodetector includes a substrate 101, a dielectric layer 102, a first electrode 103, a core 104, a second electrode 105, a light absorption layer 106, and a protective layer 107. The configurations of these constituent elements are similar to those in the first embodiment described above. In the second embodiment, a gate electrode 108 for applying an electric field to the light absorption layer 106 is further provided. The gate electrode 108 may be formed of a transparent electrode made of ZnO or the like formed on the light absorption layer 106.

According to the second embodiment, a gate electric field can be applied to the light absorption layer 106 made of graphene by the gate electrode 108 having a top gate structure using the protective layer 107 made of $Al_2O_3$ as a gate insulating layer. Thus, by applying an electric field to the light absorption layer 106, the chemical potential of graphene can be controlled, and the Seebeck coefficient can be adjusted. In the configuration of the first embodiment, photoelectric conversion can be obtained in the light absorption layer 106 unless the Seebeck coefficient is zero. However, according to the second embodiment, it is expected to further improve the detection efficiency by the optimization of the Seebeck coefficient.

Figure 8:
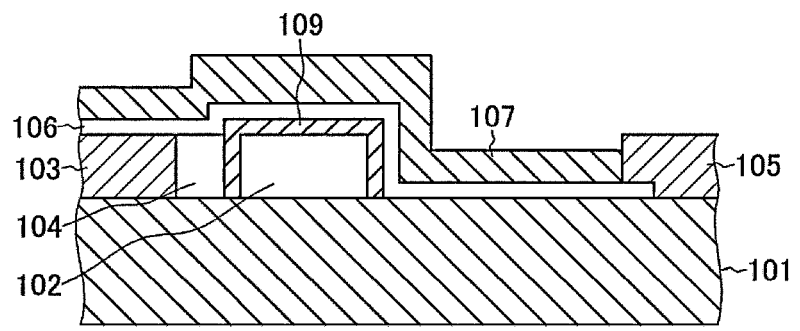
FIG. 8 is a cross-sectional view showing a configuration of another photodetector according to the second embodiment of the present invention.

As shown in FIG. 8, a gate insulating layer 109 may be provided between the dielectric layer 102 made of a semiconductor such as Si and the light absorption layer 106, and the dielectric layer 102 may be used as a back gate. The gate insulating layer 109, for example, can be made up of $Al_2O_3$. A silicon oxide layer formed by thermally oxidizing the surface of the dielectric layer 102 made of Si for about several nm to 10 nm in thickness may be used as the gate insulating layer 109. By making the gate insulating layer 109 thin within a possible range, it is expected that an electric field can be applied more effectively, and more efficient chemical potential control can be performed.

Figure 9:
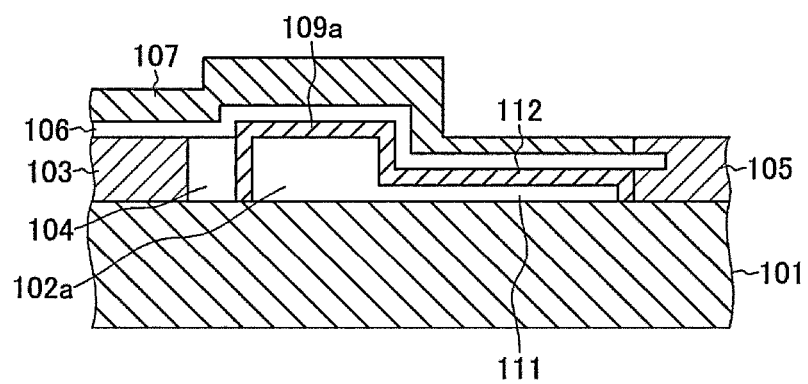
FIG. 9 is a cross-sectional view showing a configuration of another photodetector according to the second embodiment of the present invention.

Further, as shown in FIG. 9, an extension part 11 obtained by extending a part of the dielectric layer 102a is provided on the second electrode 105 side, and an extension part 112 obtained by extending a part of the gate insulating layer 109a is provided, and it is also possible to apply an electric field to the light absorption layer 106 in a wider range. For example, the extension part 11 can have a thickness of several tens of nm to 50 nm. The extension part 112 can be made of $Al_2O_3$. Further, the extension part 112 can be formed by thermally oxidizing the surface of the extension part 111.

As described above, according to t embodiments of the present invention, a light absorption layer made of graphene is provided on the first electrode, the dielectric layer and the core between them to connect the first electrode to the light absorption layer, and the second electrode connected to the light absorption layer has an interval with the dielectric layer in a range where light confinement is not possible between them. Accordingly, loss of light detection in a photodetector using graphene can be reduced and efficiency can be increased.

Meanwhile, the present invention is not limited to the above-described embodiment, and it is apparent that various modifications and combinations can be made by one skilled in the art within a technical idea of the present invention.

REFERENCE SIGNS LIST

101 Substrate
102 Dielectric layer
103 First electrode
104 Core
105 Second electrode
106 Light absorption layer
107 Protective layer
121 Optical waveguide core
122 Tapered part.

The invention claimed is:
1. A photodetector, comprising:
an insulating substrate;
a material layer on the insulating substrate and extending in a waveguide direction, the material layer having a refractive index higher than that of the insulating substrate;
a first electrode made of a metal, the first electrode extending in the waveguide direction on a first side of the material layer, and the first electrode being disposed on the insulating substrate and spaced apart from the material layer;
a core between the material layer and the first electrode, the core having a refractive index lower than that of the material layer, and the core extending in the waveguide direction;
a second electrode made of a metal and disposed on the insulating substrate on a second side of the material layer, the second electrode being spaced apart from the material layer; and
a light absorption layer electrically connected to the first electrode and the second electrode, the light absorption layer being disposed on the core and made of graphene,
wherein an interval between the material layer and the second electrode is within a range in which light confinement is possible between the material layer and the first electrode, and the interval between the material layer and the second electrode is within a range in which light confinement is not possible between the material layer and the second electrode.

2. The photodetector according to claim 1, wherein the core is a space defined by a side surface of the material layer, a side surface of the first electrode, and a lower surface of the light absorption layer.

3. The photodetector according to claim 2, wherein the space is further defined by an upper surface of the insulating substrate.

4. The photodetector according to claim 2, wherein the material layer comprises silicon, and the core is made of air.

5. The photodetector according to claim 1, further comprising:
a protective layer covering the light absorption layer.

6. The photodetector according to claim 1, further comprising:
a gate electrode configured to apply an electric field to the light absorption layer.

7. The photodetector according to claim 6, wherein the gate electrode is a transparent electrode disposed on the light absorption layer.

8. The photodetector according to claim 6, wherein the material layer is made of a semiconductor material, and
the gate electrode comprises the material layer.

9. The photodetector according to claim 6, further comprising:
a gate insulating layer between the material layer and the gate electrode.

10. A method, comprising:
forming a material layer on an insulating substrate, the material layer extending in a waveguide direction, the material layer having a refractive index higher than that of the insulating substrate;
forming a first electrode on the insulating substrate and spaced apart from the material layer, the first electrode being made of a metal and extending in the waveguide direction on a first side of the material layer, wherein a core is disposed between the material layer and the first electrode, the core having a refractive index lower than that of the material layer, and the core extending in the waveguide direction;
forming a second electrode on the insulating substrate and spaced apart from the material layer, the second electrode being made of a metal and disposed on a second side of the material layer; and
electrically connecting a light absorption layer to the first electrode and the second electrode, the light absorption layer being disposed on the core and made of graphene,
wherein an interval between the material layer and the second electrode is within a range in which light confinement is possible between the material layer and the first electrode, and
the interval between the material layer and the second electrode is within a range in which light confinement is not possible between the material layer and the second electrode.

11. The method according to claim 10, wherein the core is a space defined by a side surface of the material layer, a side surface of the first electrode, and a lower surface of the light absorption layer.

12. The method according to claim 11, wherein the space is further defined by an upper surface of the insulating substrate.

13. The method according to claim 11, wherein the material layer comprises silicon, and the core is made of air.

14. The method according to claim 10, further comprising:
forming a protective layer covering the light absorption layer.

15. The method according to claim 10, further comprising:
forming a gate electrode configured to apply an electric field to the light absorption layer.

16. The method according to claim 15, wherein the gate electrode is a transparent electrode disposed on the light absorption layer.

17. The method according to claim 15, wherein the material layer is made of a semiconductor material, and
the gate electrode comprises the material layer.

18. The method according to claim 15, further comprising:
Forming a gate insulating layer over the material layer, wherein forming the gate electrode comprises forming the gate electrode over the gate insulating layer.

* * * * *